United States Patent [19]

Skeie

[11] Patent Number: 4,620,191

[45] Date of Patent: Oct. 28, 1986

[54] SURFACE ACOUSTIC WAVE PASSIVE TRANSPONDER HAVING PARALLEL ACOUSTIC WAVE PATHS

[76] Inventor: Halvor Skeie, 3338 Pearltone Dr., San Jose, Calif. 95117

[21] Appl. No.: 509,525

[22] Filed: Jun. 30, 1983

[51] Int. Cl.[4] .................. G01S 13/80; H03H 9/21; H03H 9/205

[52] U.S. Cl. .................. 342/51; 310/313 B; 333/154; 333/196

[58] Field of Search ......... 343/6.5 SS, 6.8 R, 6.8 LC; 310/313 R, 313 B, 313 D; 333/150–155, 193–196

[56] References Cited

U.S. PATENT DOCUMENTS

| | | | |
|---|---|---|---|
| 3,273,146 | 9/1966 | Hurowitz, Jr. | 343/6.8 R |
| 3,706,094 | 12/1972 | Cole et al. | 343/6.8 R X |
| 3,755,803 | 8/1973 | Cole et al. | 343/6.8 R X |
| 3,801,935 | 4/1974 | Mitchell | 310/313 B X |
| 4,058,217 | 11/1977 | Vaughan et al. | 209/559 |
| 4,059,831 | 11/1977 | Epstein | 343/6.8 R |
| 4,263,595 | 4/1981 | Vogel | 343/6.5 SS |
| 4,494,031 | 1/1985 | Barnes et al. | 310/313 B |

Primary Examiner—T. H. Tubbesing
Assistant Examiner—Gilberto Barrón, Jr.

[57] ABSTRACT

A passive transponder for use in an interrogation/transponder system comprises a substrate having a substrate surface defining a path of travel for surface acoustic waves; a launch transducer element arranged on the surface for converting interrogating signals into surface acoustic waves which propagate along the path of travel; a plurality of tap transducer elements arranged on the surface at spaced intervals along the path of travel for converting surface acoustic waves into respective output signals; and a circuit, connected to the tap transducer elements, for combining the output signals of these transducer elements to form reply signals. In order to reduce the effect of spurious signals, the tap transducers are arranged both in series and in parallel with respect to the path of travel.

9 Claims, 10 Drawing Figures

SURFACE ACOUSTIC WAVE PASSIVE TRANSPONDER HAVING PARALLEL ACOUSTIC WAVE PATHS

CROSS REFERENCE TO RELATED APPLICATIONS

The present application is related in subject matter to the following commonly owned applications for patent:

Application Ser. No. 509,523, filed June 30, 1983, for "System for Interrogating A Passive Transponder Carrying Amplitude and/or Phase Encoded Information" of P. Nysen, H. Skeie and D. Armstrong;

Application Ser. No. 509,522, filed June 30, 1983, for "Apparatus For Compensating Non-Linearities In A Frequency-Modulated Signal" of P. Nysen;

Application Ser. No. 509,521, filed June 30, 1983, for "Surface Acoustic Wave Passive Transponder Having Optimally-Sized Transducers" of H. Skeie;

Application Ser. No. 509,524, filed June 30, 1983, for "Surface Acoustic Wave Passive Transponder Having Non-Reflective Transducers and Pads" of H. Skeie;

Application Ser. No. 509,526, filed June 30, 1983, for "Surface Acoustic Wave Passive Transponder Having Amplitude and Phase Modifying Surface Pads" of H. Skeie;

Application Ser. No. 509,527, filed June 30, 1983, for "Surface Acoustic Wave Passive Transponder Having Acoustic Wave Reflectors" of H. Skeie and P. Nysen;

BACKGROUND OF THE INVENTION

The present invention relates to a "passive interrogator label system" (PILS); that is a system comprising an interrogator for transmitting an interrogation signal, one or more "labels" or passive transponders which produce a reply signal containing coded information in response to the interrogation signal, and a receiver and decoding system for receiving the reply signal and decoding the information contained therein.

A passive interrogator label system of the type to which the present invention relates is disclosed in the U.S. Pat. No. 3,273,146 to Horwitz, Jr.; U.S. Pat. No. 3,706,094 to Cole and Vaughan; U.S. Pat. No. 3,755,803 to Cole and Vaughan; and U.S. Pat. No 4,058,217 to Vaughan and Cole. In its simplest form, the systems disclosed in these patents include a radio frequency transmitter capable of transmitting RF pulses of electromagnetic energy. These pulses are received at the antenna of a passive transponder and applied to a piezoelectric "launch" transducer adapted to convert the electrical energy received from the antenna into acoustic wave energy in the piezoelectric material. Upon receipt of a pulse, an acoustic wave is generated within the piezoelectric material and transmitted along a defined acoustic path. Further "tap" transducers arranged at prescribed, spaced intervals along this path convert the acoustic wave back into electric energy for reconversion into electrical energy by the launch transducer. The presence or absence of tap transducers at the prescribed locations along the acoustic wave path determines whether a reply pulse will be transmitted with a particular time delay, in response to an interrogation pulse. This determines the informational code contained in the transponder reply.

When an acoustic wave pulse is reconverted into an electrical signal it is supplied to an antenna on the transponder and transmitted as RF electromagnetic energy. This energy is received at a receiver and decoder, preferably at the same location as the interrogating transmitter, and the information contained in this response to an interrogation is decoded.

In the patent application Ser. No. 509,523, filed June 30, 1983, for "System for Interrogating a Passive Transponder Carrying Amplitude and/or Phase Encoded Information" of P. Nysen, H. Skeie and D. Armstrong, it is proposed to provide an interrogator for transmitting a first, interrogation signal having a first frequency which successively assumes a plurality of frequency values within a prescribed frequency range. This first frequency may, for example, be in the range of 905 to 925 MHz, a frequency band which is freely available in many parts of the world for short range transmission.

The remote, passive transponder associated with this interrogator receives the first signal as an input, and produces a second, reply signal as an output. Signal transforming means within the transponder convert the first signal in such a way as to impart a known informational code in the second signal which is associated with and identifies the particular passive transponder.

Associated with the interrogator of the system is a receiver for receiving the second signal from the passive transponder and a mixer, arranged to receive both the first signal and the second signal, or signals derived therefrom, for mixing together these two signals and thereby producing a further signal. This further signal may, for example, contain the sum and the difference frequencies of the first and the second signals, respectively.

Finally, the proposed system includes a signal processor responsive to the signal produced by the mixer for detecting the frequencies contained in this signal to thereby determine the informational code associated with the passive transponder.

In systems of the this general type, all of the tap transducers are arranged in series along a single path of travel for the surface acoustic wave. With this arrangement, however, surface acoustic wave reflections from the various tap transducers are picked up by other tap transducers and converted into spurious electrical signals. When the number of tap transducers is large, for example, up to 16 in a typical passive transponder, these spurious signals add up to a severe degradation in the desired informational component of the reply signal.

SUMMARY OF THE INVENTION

It is an object of the present invention to provide a passive transponder adapted for use in an interrogation system for transmitting a reply signal containing encoded information in response to the receipt of an interrogating signal.

It is another object of the present invention to provide a passive transponder of the above-noted type which comprises a substrate having a substrate surface defining paths of travel for surface acoustic waves; at least one launch transducer element arranged on the surface for converting the interrogating signal into surface acoustic waves which propagate along the paths of travel; a plurality of tap transducer elements arranged on the surface at spaced intervals along the paths of travel for converting a surface acoustic waves into respective output signals; and a circuit, connected to the tap transducer elements, for combining the output signals of these transducer elements to form a reply signal.

It is a further object of the present invention to provide a passive transponder of the above-noted type in which spurious signals, caused by reflections from the individual tap transducer elements are minimized.

These objects, as well as further objects which will become apparent from the discussion that follows, are achieved according to the present invention, by arranging the tap transducer elements both in series and in parallel with respect to the paths of travel of the surface acoustic waves.

In a preferred embodiment of the present invention, the tap transducer elements are arranged in parallel rows and positioned in such a way that surface acoustic waves, propogated simultaneously from the launch transducer element or elements arrive at each tap transducer at a different time.

In order to facilitate simultaneous transmission of surface acoustic waves along parallel paths of travel, the separate launch transducer elements may be connected electrically in series and/or in parallel.

For a full understanding of the present invention, reference should now be made to the following detailed description of the preferred embodiments of the invention and to the accompanying drawings.

DESCRIPTION OF THE PREFERRED EMBODIMENTS

Figure 1:
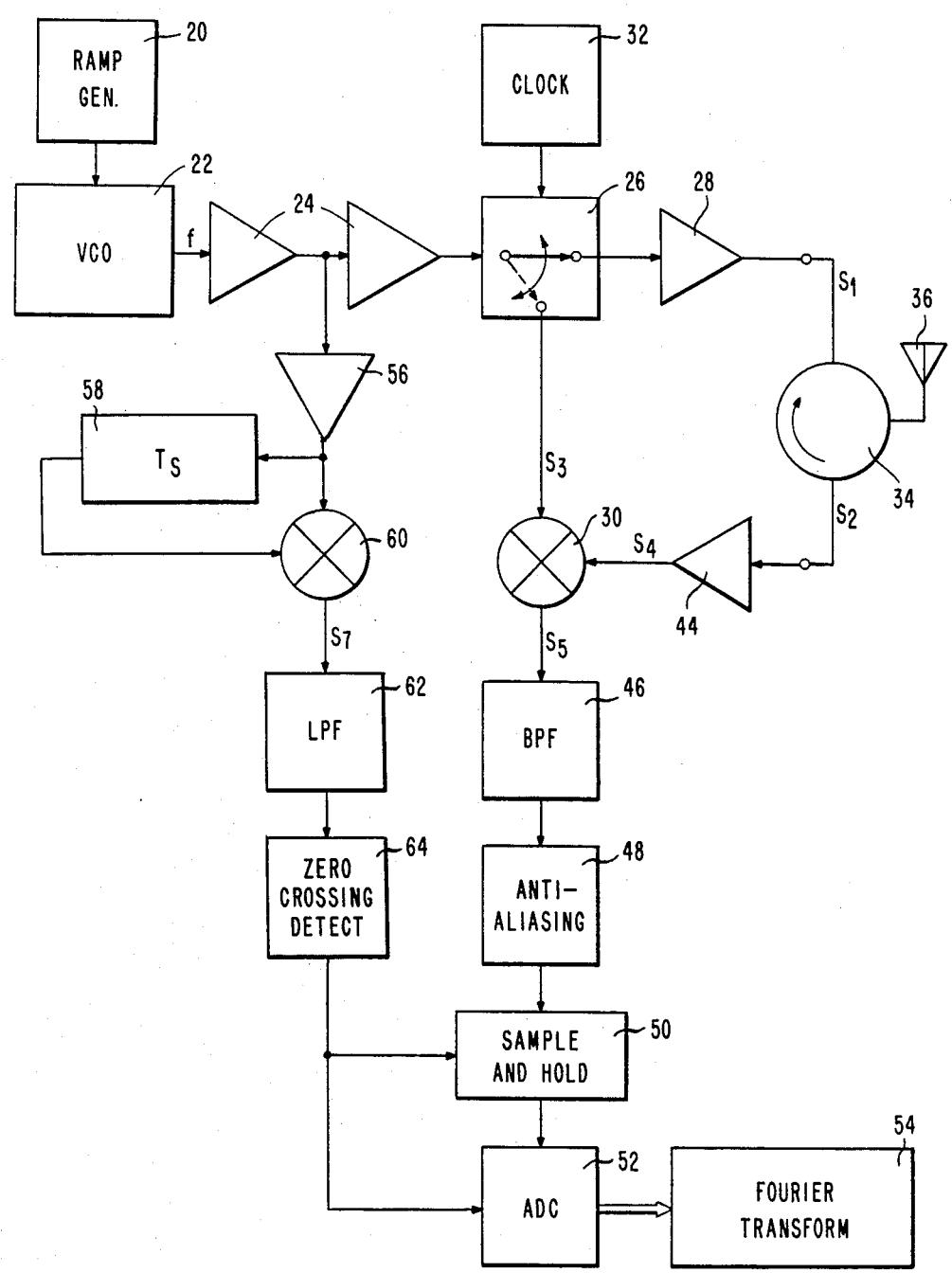
FIG. 1 is a block diagram of a system for transmitting an interrogation signal, receiving a reply signal and decoding information encoded in the reply signal.

The present invention will now be described with reference to FIGS. 1-9 of the drawings. Identical elements in the various figures are designated by the same reference numerals.

FIGS. 1-7 illustrate an interrogator-transponder system employing a surface acoustic wave transponder which may form the environment of the present invention. A system of this general type is disclosed in the U.S. Pat. No. 3,706,094 to Cole and Vaughn. This particular system is described in detail in the commonly-owned patent application Ser. No. 509,523, filed June 30, 1983, for "System for Interrogating a Passive Transponder Carrying Amplitude and/or Phase-Encoded Information" of P. Nysen, H. Skeie and D. Armstrong.

The transmitter/receiver and decoder system shown in FIG. 1 comprises a ramp generator 20 which supplies a sawtooth waveform to a voltage controlled oscillater (VCO) 22. The VCO produces an output signal of frequency f which repeatedly ramps linearly upward from a frequency of 905 MHz to a frequency of 925 MHz. This signal is amplified by the RF amplifiers 24 and supplied to a transmit/receive switch 26. The switch 26 directs the signal either to a transmitter power amplifier 28 or to a decoding mixer 30. The switch 26 is controlled by a 100 KHz square wave signal produced by a clock 32. The output signal $S_1$ from the amplifier 28 is supplied to an external circulator 34 or transmit/receive (TR) switch and is transmitted as electromagnetic radiation by an antenna 36.

Figure 2:
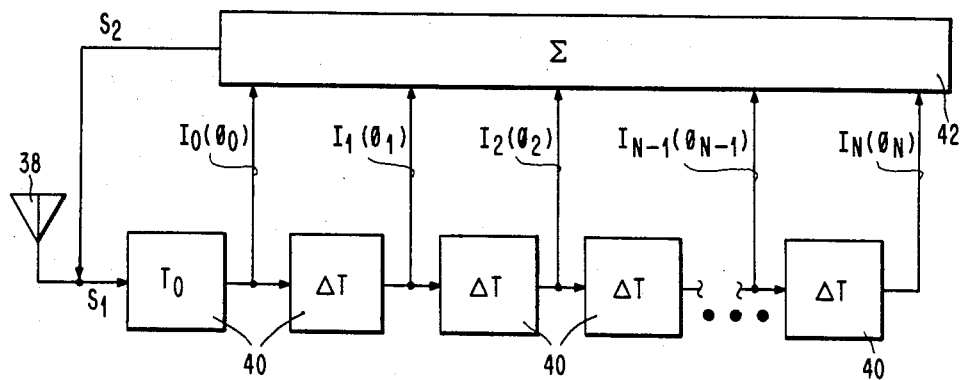
FIG. 2 is a block diagram of a passive transponder adapted for use with the system of FIG. 1.

A block diagram of the transponder associated with the system of FIG. 1 is shown in FIG. 2. The transponder receives the signal $S_1$ at an antenna 38 and passes it to a series of delay elements 40 having the indicated delay periods $T_0$ and $\Delta T$. After passing each successive delay, a portion of the signal $I_0, I_1, I_2 \ldots I_N$ is tapped off and supplied to a summing element 111. The resulting signal $S_2$, which is the sum of the intermediate signals $I_0 \ldots I_N$, is fed back to the antenna 38 for transmission to the antenna 36 in the system of FIG. 1.

The transponder reply signal $S_2$ is received by the antenna 36 and passed through the circulator or TR switch 34 to a receiver amplifier 44. The output $S_4$ of this amplifier 44 is heterodyned in the mixer with the signal $S_3$ intermittently presented by the switch 26.

The output $S_5$ of the mixer 30 contains the sum and the difference frequencies of the signals $S_3$ and $S_4$. This output is supplied to a band pass filter 46 with a pass band between 1 and 3 KHz. The output of this filter is passed through an anti-aliasing filter 48 to a sample-and-hold circuit 50.

The sample-and-hold device supplies each sample to an analog-to-digital converter 52. The A/D converter, in turn, presents the digital value of this sample to a processor 54 that analyzes the frequencies contained in the signal by means of a Fourier transform. The sample-and-hold device 50 and the A/D converter 52 are strobed by a sampling signal which serves to compensate for the non-linearity, with respect to time, in the monotonically increasing frequency f of the VCO output signal.

To effect compensation the signal of frequency f produced by the VCO 22 is passed via an isolating amplifier 56 to a delay element 58 with a constant signal delay $T_s$. Both the delayed and the undelayed signals are supplied to a mixer 60 which produces a signal $S_7$ containing both sum and difference frequencies. The signal $S_7$ is supplied to a low-pass filter 62 which passes only the portion of this signal containing the difference frequencies. The output of the low-pass filter is supplied to a zero-crossing detector 64 which produces a pulse at each positive (or negative) going zero crossing. These pulses are used to strobe the sample-and-hold device 50 and the A/D converter 52.

Figure 3:
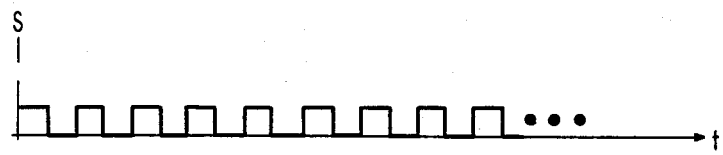
FIG. 3 is a timing diagram indicating the clock output in the system of FIG. 1.
Figure 4:
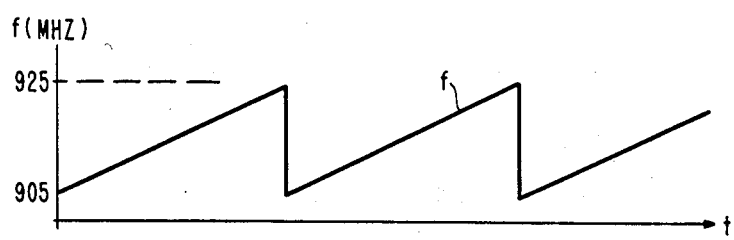
FIG. 4 is a frequency vs. time diagram illustrating the transmitted signal in the system of FIG. 1.
Figure 5:
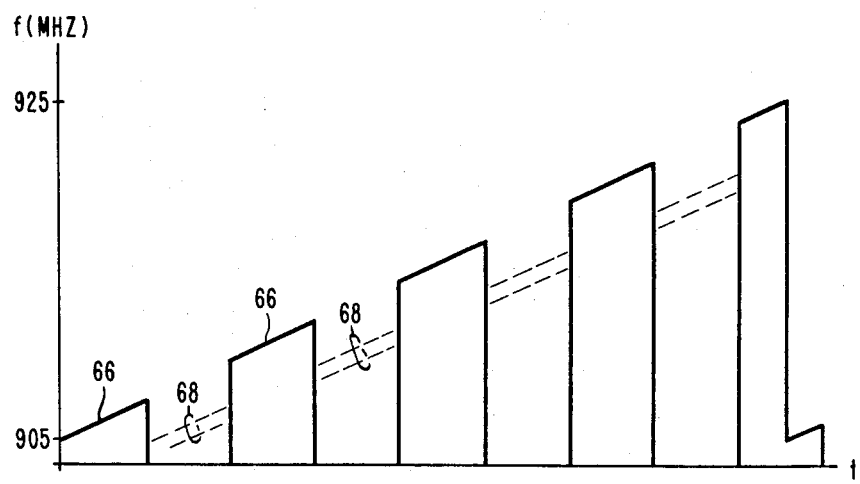
FIG. 5 is a frequency vs. time diagram illustrating both the transmitted and the received signal in the system of FIG. 1.

FIGS. 3-5 illustrate the operation of the circuit of FIG. 1. FIG. 3 shows the 100 KHz output of the clock 32; FIG. 4 shows the frequency sweep of the signal produced by the VCO 22. FIG. 5 shows, in solid lines 66, the frequency of the transmitted signal $S_1$ and, in dashed lines 68, the frequency of the signal $S_2$ as received from the transponder. As may be seen, the signal 68 is received during the interval between transmissions of the signal 66. These intervals are chosen to equal, approximately, the round trip delay time between the transmission of a signal to the transponder and the receipt of the transponder reply. As indicated by the multiple dashed lines, the transponder reply will contain a number of frequencies at any given instant of time as a result of the combined (i.e., summed) intermediate signals having different delay times ($T_0$, $T_0+\Delta T$, $T_0+2 \Delta T$, ... $T_0+N \Delta T$).

Figure 6:
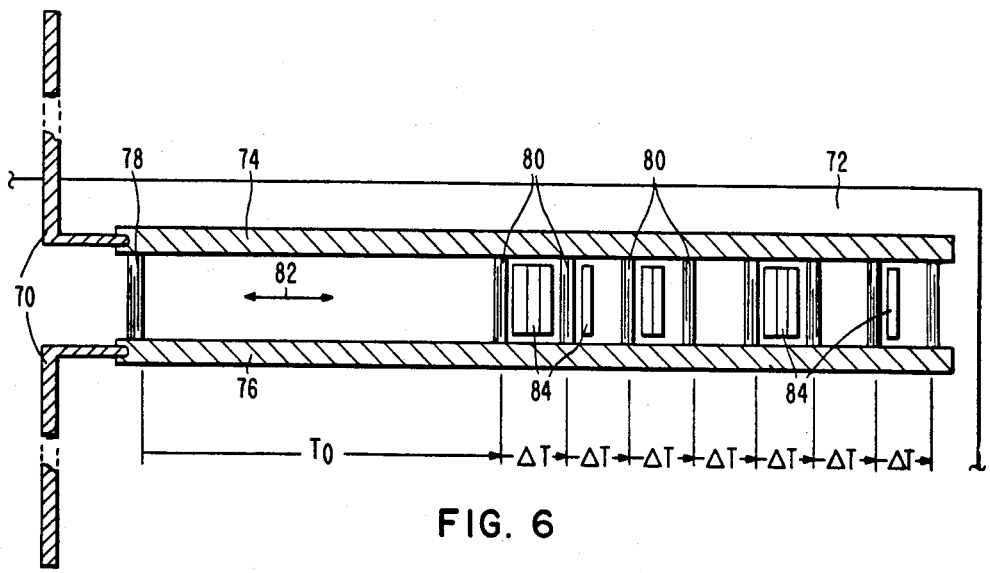
FIG. 6 is a plan view, in enlarged scale, of a particular implementation of the transponder of FIG. 2.
Figure 7:
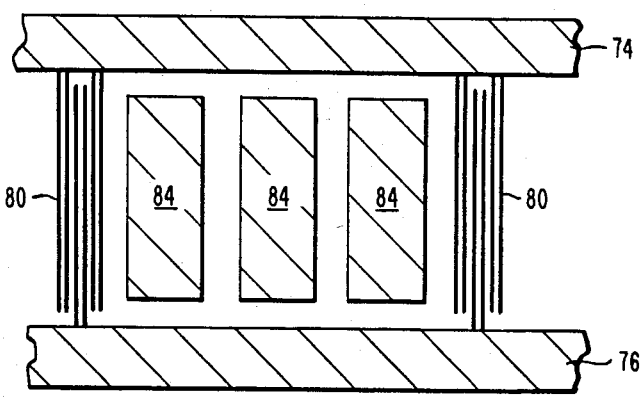
FIG. 7 is a plan view, in greatly enlarged scale, of a portion of the implementation shown in FIG. 6.

FIGS. 6 and 7 illustrate an embodiment of a passive transponder which implements the block diagram of FIG. 2. This transponder operates to convert the received signal $S_1$ into an acoustic wave and then to reconvert the acoustic energy back into an electrical signal $S_2$ for transmission via a dipole antenna 70. More particularly, the signal transforming element of the transponder includes a substrate 72 of piezoelectric material such as a lithium niobate ($LiNbO_3$) crystal. On the surface of this substrate is deposited a layer of metal, such as aluminum, forming a pattern such as that shown in detail in FIG. 7. For example, this pattern may consist of two bus bars 74 and 76 connected to the dipole antenna 70, a "launch" transducer 78 and a plurality of "tap" transducers 80. The bars 74 and 76 thus define a pth of travel 82 for a surface acoustic wave which is generated by the launch transducer and propogates substantially linearly, reaching the tap transducers each in turn. The tap transducers convert the surface acoustic wave back into electrical energy which is collected and therefore summed by the bus bars 74 and 76. This electrical energy then activates the dipole antenna 70 and is converted into electromagnetic radiation for transmission as the signal $S_2$.

The tap transducers 80 are provided at equally spaced intervals along the surface acoustic wave path 82, as shown in FIG. 6, and an informational code associated with the transponder is imparted by providing a selected number of "delay pads" 84 between the tap transducers. These delay pads, which are shown in detail in FIG. 7, are preferably made of the same material as, and deposited with, the bus bars 74, 76 and the transducers 78, 80. Each delay pad has a width sufficient to delay the propagation of the surface acoustic wave from one tap transducer 80 to the next by one quarter cycle or 90° with respect to an undelayed wave at the frequency of operation (circa 915 MHz). By providing locations for three delay pads between successive tap transducers, the phase $\phi$ of the surface acoustic wave received by a tap transducer may be controlled to provide four phase possibilities:

1. No pad between successive tap transducers $= -90°$;
2. One pad between successive tap transducers $=0°$;
3. Two pads between successive tap transducers $=+90°$
4. Three pads between successive tap transducers $=+180°$.

Referring to FIG. 2 the phase information $\phi_0$ (the phase of the signal picked up by the first tap transducer in line), and $\phi_1, \phi_2 ... \phi_N$ (the phases of the signals picked up by the successive tap transducers) is supplied to the combiner (summer) which in the embodiment of FIG. 6 comprises the bus bars 74 and 76. This phase information, which is transmitted as the signal $S_2$ by the antenna 70, contains the informational code of the transponder.

In the passive transducer embodiment shown in FIGS. 6 and 7, the code imparted to the transponder reply signal may be of any desired length, depending upon the number of tap transducers 80 with theie interspersed delay pads 84. In practice, however, there is a limit to the number of tap transducers and pads which may be assembled acoustically in series along the common bus bars 74 and 76 in the manner shown in FIG. 6.

In particular:

(1) To permit the reply signal to be received during a period separate and distinct from a transmitted signal, it is necessary that the time period $T_0$ be greater than the sum of the individual times $\Delta T$ between successive tap transducers. Thus, $$T_0 > N \Delta T,$$

where N is the number of tap transducers.

As the number of tap transducers increases to increase the length of the transponder code, the time $T_0$ must also be correspondingly increased. The distance between the launch transducer 78 and the first tap transducer 80 must be greater than the distance between the first tap transducer 80 and the last tap transducer 80 in series along the bus bars 74 and 76. Although the dimensions are acceptable in the case of eight tap transducers, considerable chip real estate is consumed when the number of tap transducers equals or exceeds sixteen.

(2) Since tap transducers also act as launch transducers as well as partial reflectors of surface acoustic waves, an increase in the number of tap transducers results in a corresponding increase in spurious signals in the transponder replies. Although such spurious signals may be at an acceptably low level with eight tab transducers arranged in series, this level may become unacceptably high when the transponder includes sixteen or more tap transducers in series.

These problems in the prior known passive transponder systems are overcome according to the present invention by arranging the tap transducers acoustically in parallel as well as in series. Such a parallel arrangement permits the reduction of the number of tap transducers arranged acoustically in series for a given number of tap transducers.

Figure 8:
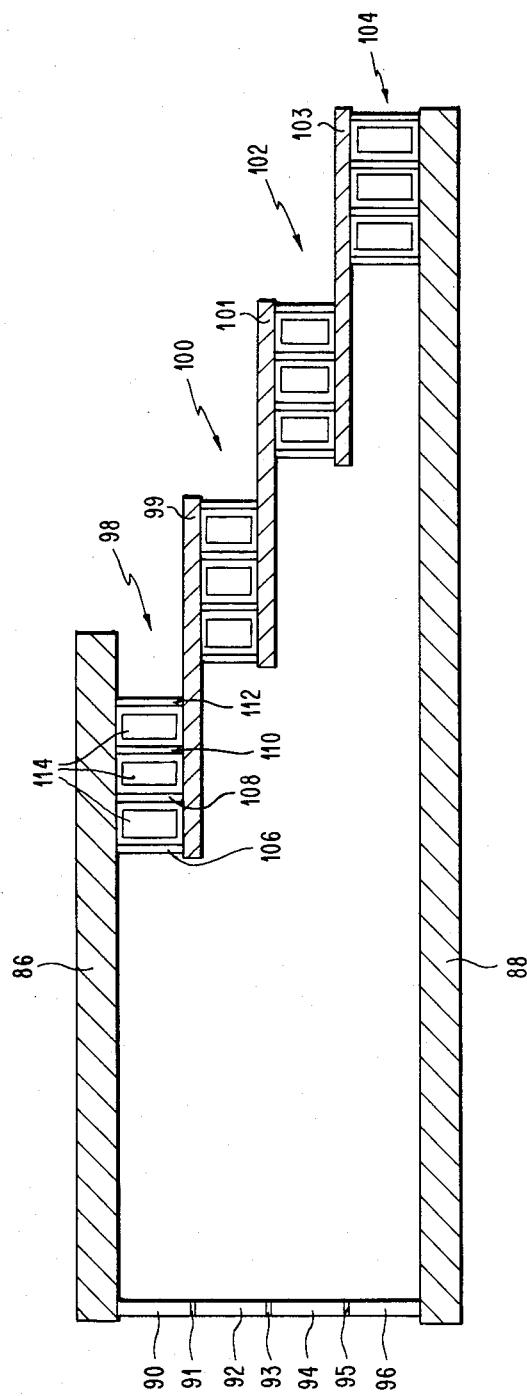
FIG. 8 is a plan view, in enlarged scale, of a launch transducer/tap transducer arrangement according to one preferred embodiment of the present invention.
Figure 9:
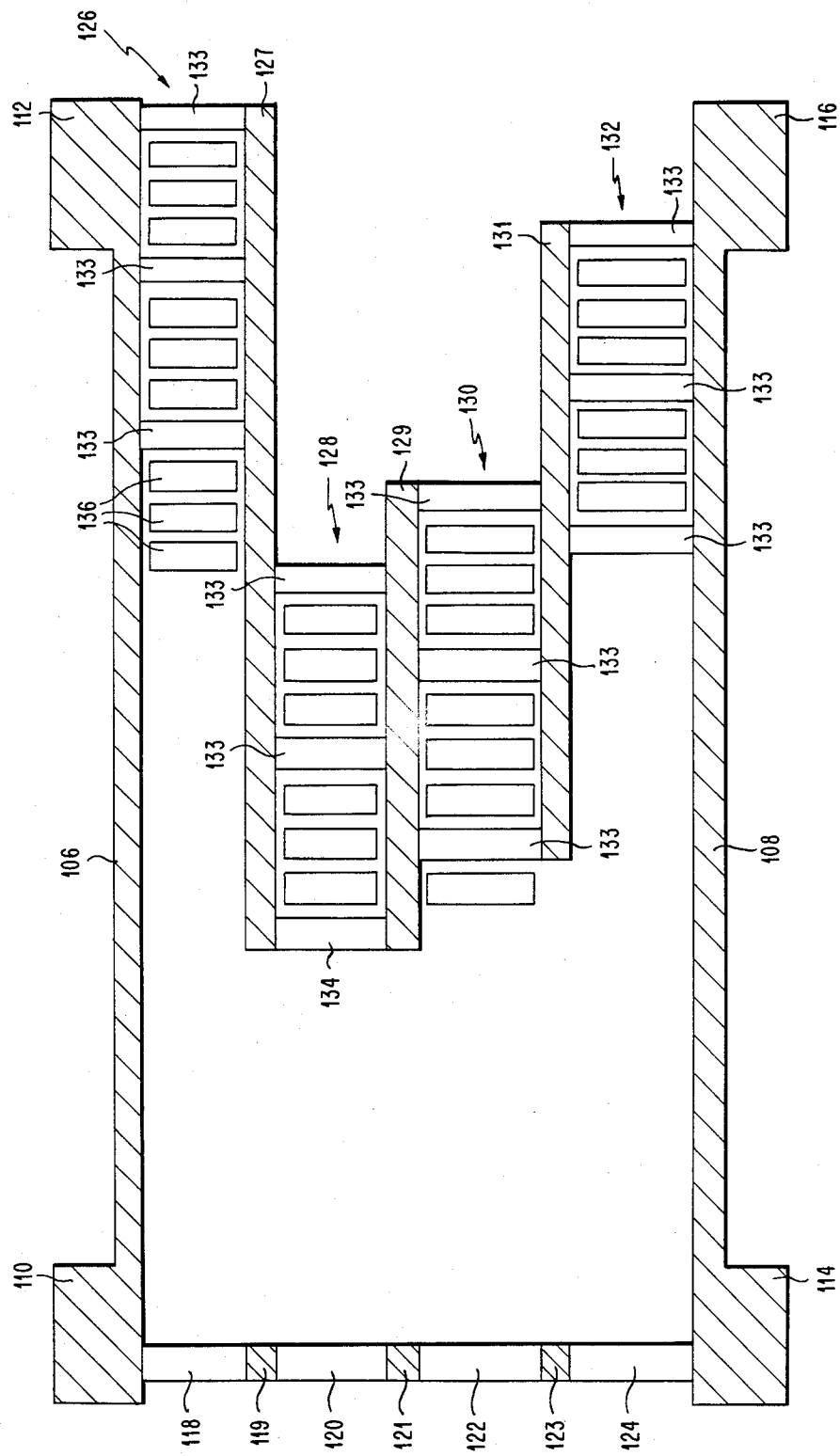
FIG. 9 is a plan view, in enlarged scale, of a launch transducer/tap transducer arrangement according to a second preferred embodiment of the present invention.

FIGS. 8 and 9 illustrate preferred embodiments of the series/parallel arrangement according to the invention. In FIG. 8, two bus bars 86 and 88 are connected to the dipole antenna (not shown); between these bus bars are four launch transducers 90, 92, 94 and 96 connected electrically in series by means of small electrodes 91, 93 and 95. At the opposite end of the bus bars 86 and 88 are four sets 98, 100, 102 and 104 of tap transducers connected electrically in series. Each set of tap transducers comprises four transducers connected electrically in parallel. For example, the set 98 includes transducers 106, 108, 110 and 112.

Between these transducers are the usual delay pads 114, illustrated in FIG. 8 simply as blocks between the respective transducers. As described above, each block 114 may contain up to three delay pads of the type illustrated in FIG. 7.

The sets of tap transducers 98, 100, 102 and 104 are separated by intermediate bus bars 99, 101 and 103. These bus bars electrically connect the individual sets of transducers in series. The electrical path through a transducer is effected by capacative coupling.

In operation, if an RF signal pulse received by the dipole antenna is applied to the bus bars 86 and 88, it is converted to four parallel surface acoustic waves by the launch transducers 90, 92, 94 and 96. These waves propogate with substantially planar wave fronts toward the tap transducer sets 98, 100, 102 and 104. As the tap transducers reconvert the surface acoustic wave energy into electrical energy, the electrical signals are collected and supplied to the bus bars 86 and 88. For example, the electrical signal picked up by the transducer 106 is supplied directly to the bus bar 86 on one side, and it is passed through the bus bar 99, the transducers in the transducer set 100, the bus bar 101, the transducers of the transducer set 102, the bus bar 103 and the transducers of the transducer set 104 to the bus bar 88 on the other side.

FIG. 9 illustrates another embodiment of the series/parallel arranged tap transducers in a passive transponder. This embodiment has a somewhat improved balance over the embodiment of FIG. 8 so that the transponder "looks alike" from both bus bars.

In particular, this transponder includes bus bars 106 and 108 having pads 110, 112, 114 and 116, respectively, for a connection to one or more dipole antennas. As in the embodiment of FIG. 8, launch transducers 118, 120, 122 and 124 are connected in series to the bus bars 106 and 108 with electrodes 119, 121 and 123 connected between them.

As may be seen, four sets of tap transducers 126, 128, 130 and 132 are connected electrically in series to the bus bars 106 and 108 with the aid of intermediate bus bars 127, 129 and 131. The tap transducer sets are each provided with three tap transducers 133 and 134. With the exception of the tap transducer 134, which is closest to the launch transducer, all of the tap transducers 133 may have up to three delay pads 136 arranged in front of them. Since the tap transducer 134 provides the phase reference for the transponder, there is no reason to arrange delay pads in front of it.

The main bus bars 106 and 108, the intermediate bus bars 127, 129 and 131, the launch and tap transducers as well as the electrodes 119, 121 and 123 and the delay pads 136 are all made of the same material (e.g., aluminum) and deposited at the same time on the piezoelectric substrate in a manner well known in the art. For example, the surface of the piezoelectric substrate may be covered with a layer of aluminum and this layer may be selectively etched using a photo-resist mask.

Figure 10:
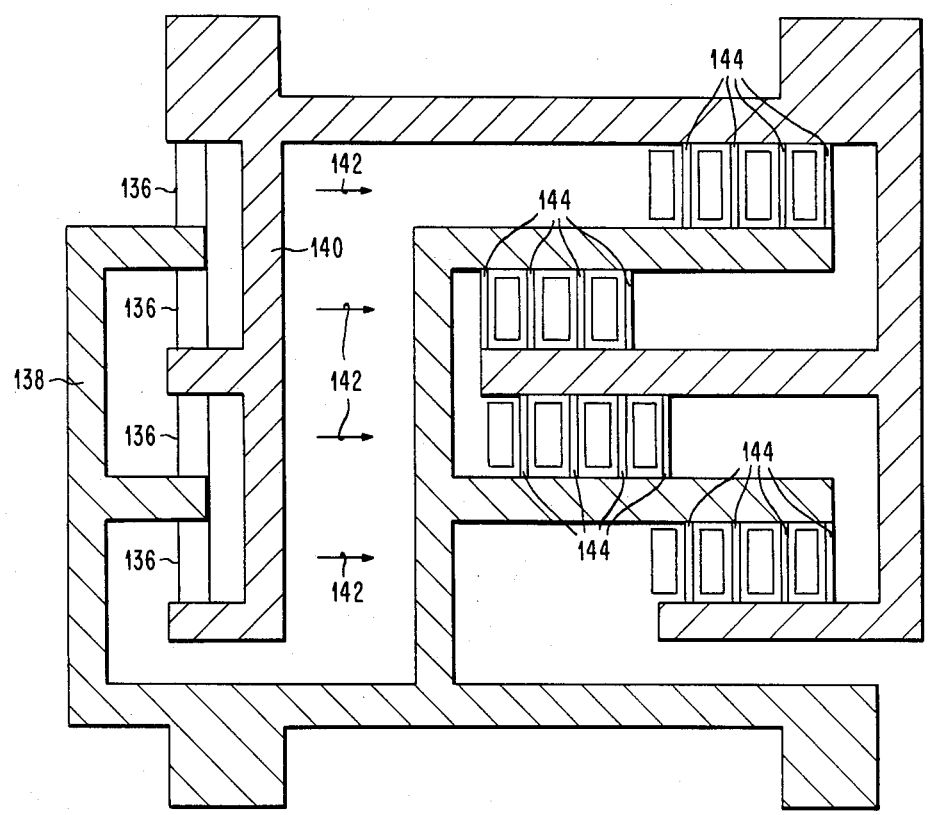
FIG. 10 is a plan view, in enlarged scale, of a launch transducer/tap transducer arrangement according to a third preferred embodiment of the present invention.

From the discussion above as well as from FIGS. 6-9 of the drawings, it will be understood that the transducers may be connected *electrically* either in series or parallel or *acoustically* in series or parallel. As is illustrated, for example, in FIG. 9 the transducers 118, 120, 122 and 124 may be connected electrically in *series*, while arranged acoustically in *parallel*. Similarly, as is illustrated in FIG. 6, the transducers 80 may be connected electrically in *parallel* but acoustically in *series*. It is not always necessary, however, to electrically connect the transducers in one sense (series or parallel) and acoustically in the opposite sense (parallel or series). FIG. 10 illustrates another embodiment of the invention which illustrates this point.

FIG. 10 shows four launch transducers 136 connected electrically in parallel by bus bars 138 and 140. These launch transducers are also arranged acoustically in parallel to generate surface acoustic waves which travel along four parallel paths of travel 142. As may be seen, the acoustic waves must pass beneath the bus bar 140; however since this bus bar is of constant width, it will impart an equal delay to each of the four parallel acoustic waves.

Similarly, the tap transducers 144 are electrically connected both in series and in parallel, and are arranged acoustically both in series and in parallel.

Arranging the tap transducers acoustically in parallel results in still another advantage over a transponder wherein the tap transducers are acoustically arranged in series. From the perspective of a given tap transducer, the relative load impedance represented by all the other tap transducers is smaller in the parallel coupled arrangement than in the series coupled arrangement; therefore, the re-excitation of this tap transducer by other tap transducers will be smaller.

There has thus been shown and described a novel surface acoustic wave passive transponder, having parallel acoustic wave paths, which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention which is limited only by the claims which follow.

What is claimed is:

1. In a passive transponder adapted for use in an interrogation system for transmitting a reply signal containing coded information in response to the receipt of an interrogating signal, said transponder comprising:
   (a) a substrate having a substrate surface defining paths of travel for surface acoustic waves;
   (b) at least one launch transducer arranged on said surface for converting said interrogating signal into surface acoustic waves which propagate along said paths of travel;
   (c) a plurality of tap transducers arranged on said surface at spaced intervals along said paths of travel for converting said surface acoustic waves into respective output signals; and
   (d) circuit means connected to said tap transducers for combining said output signals to form said reply signal;
   the improvement wherein said tap transducers are arranged acoustically both in series and in parallel along said paths of travel.

2. The improvement defined in claim 1, wherein said tap transducers are arranged such that said acoustic waves, propagated simultaneously from said at least one launch transducer, arrive at each tap transducer at a different time.

3. The improvement defined in claim 2, wherein said tap transducers are arranged such that said acoustic waves, propagated simultaneously from said at least one launch transducer, arrive at all of the tap transducers arranged in one series path before arriving at the tap transducers arranged in another, parallel path.

4. The improvement defined in claim 1, wherein said at least one launch transducer comprises a plurality of separate transducer elements connected electrically in series.

5. The improvement defined in claim 1, wherein said tap transducers are arranged in parallel rows.

6. The improvement defined in claim 5, wherein said tap transducers are arranged in four parallel rows.

7. The improvement defined in claim 5, wherein said rows are successively further away from said at least one launch transducer, starting with the row on one side.

8. The improvement defined in claim 5, wherein the two side rows are further away from said at least one launch transducer than the center rows.

9. The improvement defined in claim 1, wherein said at least one launch transducer comprises a plurality of separate transducer elements connected electrically in parallel.

* * * * *